United States Patent [19]
Masubuchi

[11] Patent Number: 4,723,837
[45] Date of Patent: Feb. 9, 1988

[54] METAL-INSULATING FILM-METAL DIODE

[75] Inventor: Sadao Masubuchi, Tokorozawa, Japan

[73] Assignee: Citizen Watch Co., Ltd., Tokyo, Japan

[21] Appl. No.: 671,782

[22] Filed: Nov. 15, 1984

[30] Foreign Application Priority Data

Nov. 15, 1983 [JP] Japan ................. 58-214722

[51] Int. Cl.⁴ ........................................ G02F 1/13
[52] U.S. Cl. ............................. 350/334; 357/6; 357/68
[58] Field of Search ................. 350/334; 357/6, 68

[56] References Cited

U.S. PATENT DOCUMENTS 4,413,883 11/1983 Baraff et al. ................. 350/334
4,534,623 8/1985 Araki ........................... 350/334

Primary Examiner—John K. Corbin
Assistant Examiner—Martin Lerner
Attorney, Agent, or Firm—Sherman and Shalloway

[57] ABSTRACT

A MiM diode constructed by at least two functional parts in diodes, and a shape of the functional parts of the diodes is defined in such that the sum of area of the functional parts of the diodes is constant with respect to amount of deviation from a certain value in mask alignment.

1 Claim, 7 Drawing Figures

METAL-INSULATING FILM-METAL DIODE

BACKGROUND OF THE INVENTION

1. Field of the Invention

The present invention relates to liquid crystal display panels in which a substrate on which a metal-insulating film-metal diode (hereinafter referred to simply as "MiM diode") has been formed is utilized, and particularly to a construction of electrodes in the MiM diode.

2. Description of the Prior Art

As a method for increasing number of display picture elements in a liquid crystal display panel, such a method wherein active substrates fabricated by forming an active element such as transistor, diode or the like on a substrate constructing liquid crystal display panel are utilized has been proposed.

In view of manufacturing cost of liquid crystal display panel, when compared transistor type element with that of diode type, diode type is superior because of simplicity in manufacturing process of active elements. Among others, MiM diode system of Ta-$Ta_2O_5$-Cr construction is simpler than pn diode system in its manufacturing process of elements so that such system is promising.

For the sake of high density display, when a shape of picture elements is made small in a MiM-LCD the liquid crystal display panel of which is formed with a substrate provided with a MiM diode having Ta-$Ta_2O_5$-Cr construction, capacity of the crystal layer decreases, whilst capacity of the MiM diode increases relatively. Thus crosstalk between picture elements arises due to capacity coupling so that the display quality decreases remarkably.

As a method for reducing capacity of MiM diode, such a method in which width of metal electrodes in a MiM diode is narrowed to decrease area of the diode, whereby its capacity is reduced has been proposed (Reference for literature: Baraff et al., SjD Conference, 1980).

In the above method, it is required that the area of electrodes in the MiM diode is about 3 $\mu$m$\times$3 $\mu$m for keeping the capacity of the MiM diode sufficiently small in order to drive picture elements having an area of 100 $\mu$m$^\square$. For this purpose, it is necessary that Ta film etching of 3 $\mu$m width as well as Cr film etching of 3 $\mu$m width are carried out uniformly over the whole surface of its liquid crystal display panel substrate with favorable reproducibility. In the above process, however, since a resist used for etching has a very narrow width of 3 $\mu$m, adhesion of the resist decreases so that the resist is separated. Hence there is such a disadvantage in the above process that it is very difficult to effect the etching over a wide area with uniformity as well as favorable reproducibility.

SUMMARY OF THE INVENTION

It is an object of the present invention to fabricate reliably and inexpensively a MiM-LCD.

In the present invention, the above object can be attained by divising diode electrode pattern of MiM diodes.

More specifically, the present invention relates to a MiM diode which is composed of an insulating film, a metallic film contacting with either surface of said insulating film, and another metallic film contacting with the surface of said insulating film opposite to the former surface, and in which electricity is conducted through a part formed by overlapping both said metallic films within said insulating film, characterized in that said part overlapped is separated into at least two sections, and said part overlapped has such a shape by which the sum of area in said sections of said overlapped part becomes contact with respect to variation in relative positions of both said metallic films within a certain value other than zero.

The above and other objects will become apparent from the following detailed description taken in connection with the accompanying drawings.

DESCRIPTION OF THE PREFERRED EMBODIMENTS

The present invention will be described in detail by referring to the accompanying drawings hereinbelow.

Figure 1:
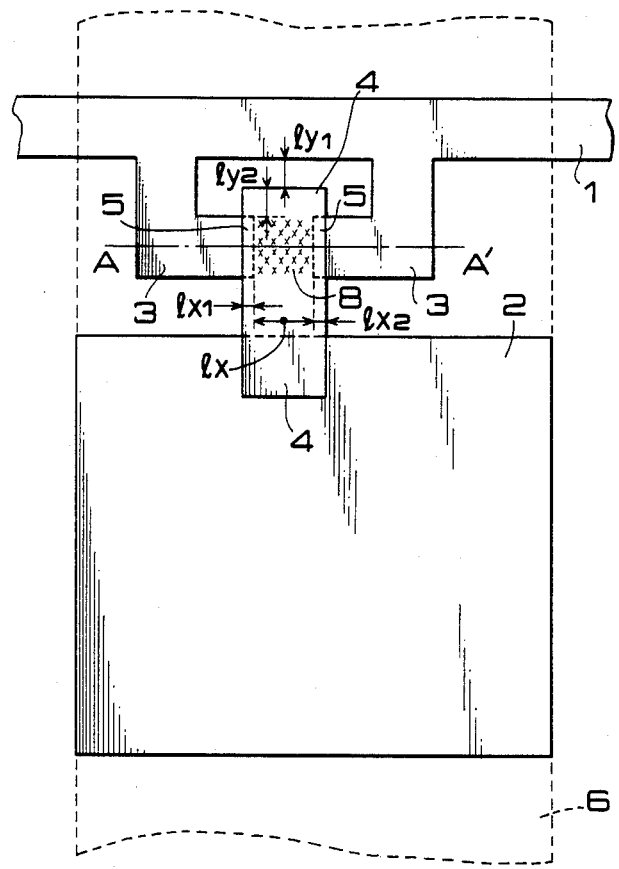
FIG. 1 is a plan view showing a shape of picture element involving the MiM diode according to the present invention.

The first embodiment of the invention is illustrated in FIG. 1 as a construction of single picture element wherein reference numeral 1 designates a scanning electrode wire being a Ta metal wire or a Ta wire the surface of which has been anodized, and a width of the wire is within a range of about 10–40 $\mu$m. An indication electrode 2 is made of a transparent conductive film such as ITO and the like. A diode electrode 3 is made of a Ta film the surface of which has been anodized, and a width of the diode electrode is about 10 $\mu$m. Another diode electrode 4 is made of a Cr film and a width of which is about 20 $\mu$m. A portion 5 having a width of about 2 $\mu$m formed by overlapping the diode electrode 3 with the diode electrode 4 is a diode area of MiM diode.

Figure 2:
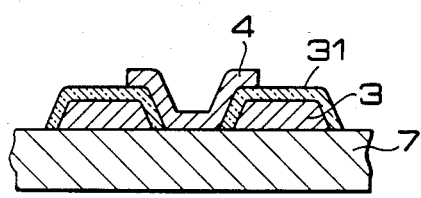
FIG. 2 is a sectional view showing the shape of picture element taken along line A—A' of FIG. 1.

FIG. 2 is a sectional view showing a shape of the picture element involving the MiM diode according to the present invention taken along line A—A' of FIG. 1 wherein reference numeral 7 designates a substrate, and an insulating layer 31 is disposed between the diode electrode 3 and the diode electrode 4. The insulating layer 31 is a $Ta_2O_5$ film having a thickness of about 30 nm and formed by anodizing a Ta film. A signal electrode wire 6 is formed with a transparent conductive film which has been patterned on another substrate being opposed to the substrate 7. A liquid crystal layer is formed between these two substrates.

A process for forming the MiM diode is as described hereinbelow.

A passivation thin film such as $SiO_2$, $Ta_2O_5$, $Al_2O_3$ or the like is formed on the whole surface of the substrate 7. Then an ITO film having a thickness of about 50 nm is formed over the whole surface of the passivation film and patterned to fabricate the indication electrode 2. Thereafter a Ta film having a thickness of about 300 nm is placed over the whole surface of the ITO film and patterned in accordance with reactive etching to form the scanning electrode wire 1 and the diode electrode 3. An insulating layer of the $Ta_2O_5$ layer 31 having a thickness of about 30 nm is then formed on a part other than external terminal portion of the Ta pattern in accordance with anodic oxidation. Finally a Cr film of about 100 nm thickness is provided over the insulating layer and patterned to form the diode electrode 4.

The diode area is the sum of two overlapped portions 5. Since only a part of the area in the diode electrode 4 contributes to diode operation, width of the diode electrode 4 can be made larger than $l_x$ so that the diode electrode 4 can maintain adhesion of resist at the time of patterning.

The present embodiment of the invention has the following characteristic features.

(1) The MiM diode has small capacity.

(2) The MiM diode has large allowance in mask alignment.

With respect to item (1), since its diode electrode is also formed on a part 8 being marked x in FIG. 1 in a conventional diode, its electrode area becomes wide so that the capacity becomes large and it results in crosstalk between picture elements.

On the other hand, since no diode electrode 3 is formed on the x marked part 8 in the present invention, the capacity is small so that crosstalk is prevented.

The contents of item (2) will be described hereinbelow. Area of the diode electrodes is decided at the time when the Cr pattern is finally formed. In the diode pattern shown in FIG. 1, the sum of two overlapped portions 5 corresponding to the area of the diode electrodes is constant, even if there is a deviation of both the diodes from one another in case of mask alignment within a range defined by $l_{x1}$ in the right direction, $l_{x2}$ in the left direction, $l_{y1}$ in the upper direction, and $l_{y2}$ in the lower direction. Thus electrical characteristics of the MiM diode dependent upon the area of the diodes become uniform in the respective picture elements. As a result, uniform display can be obtained in contrast ratio.

Figure 3:
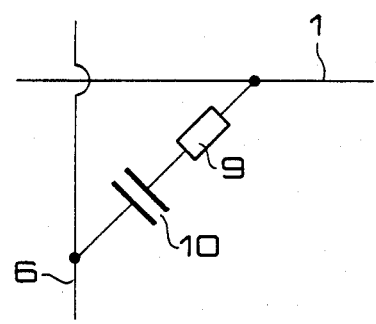
FIG. 3 is an electrical, equivalent circuit for picture elements.
Figure 4:
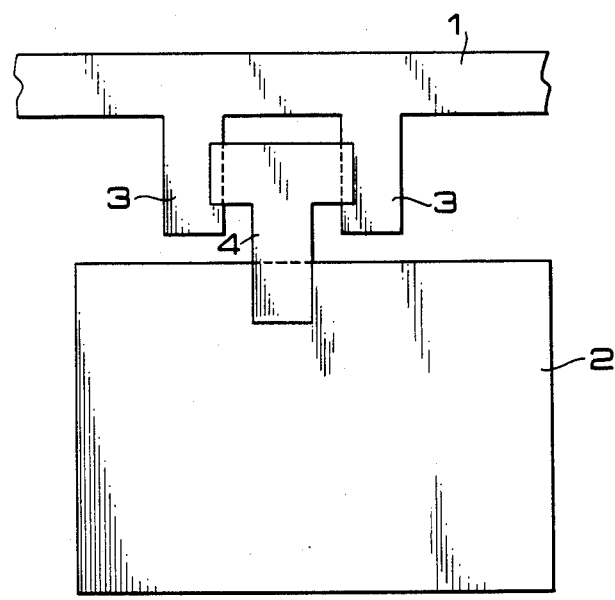
FIGS. 4–7 are plan views each showing a shape of picture element involving the MiM diode according to the present invention.
Figure 5:
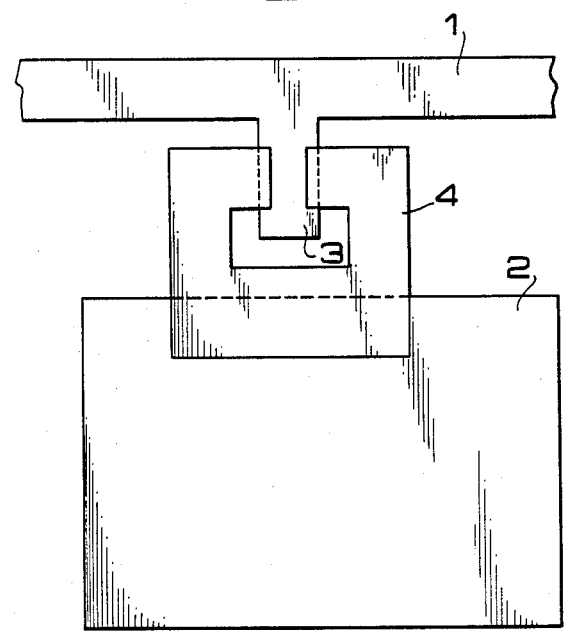
Figure 6:
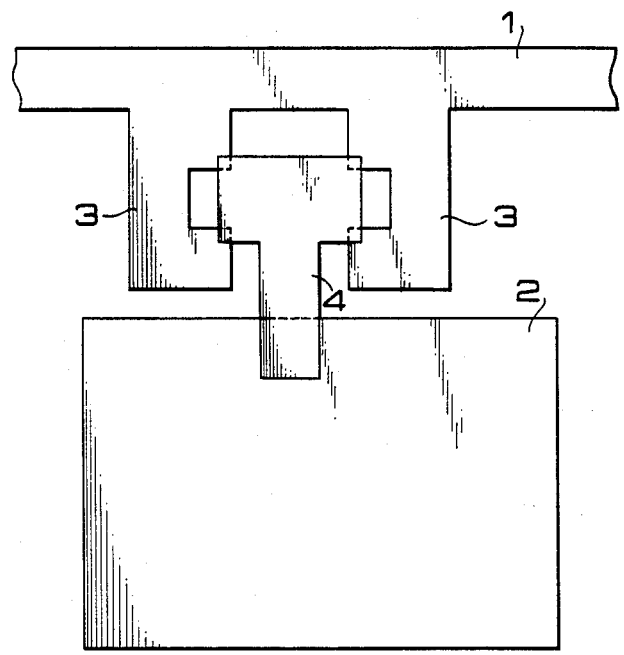
Figure 7:
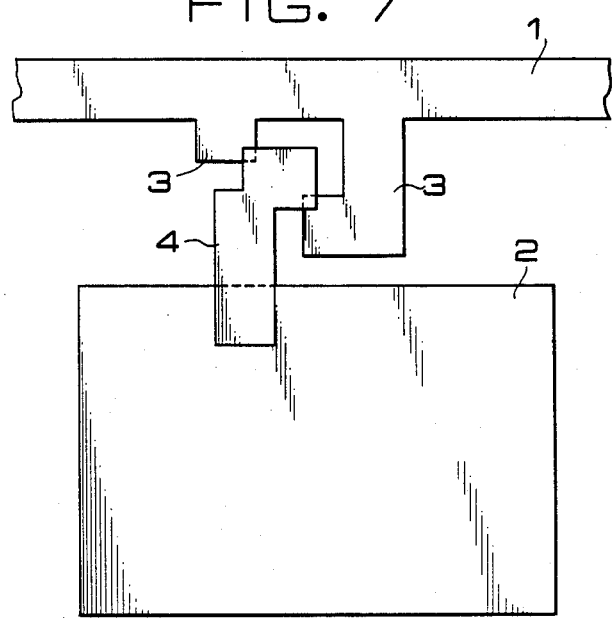

The picture elements are driven in accordance with a conventional manner. An equivalent circuit for the picture elements is shown in FIG. 3 wherein reference numeral 9 designates a MiM diode composed of the diode electrode 3, the diode electrode 4, and the insulating film 31 as described above. A display picture element capacity 10 comprises the indication electrode 2, the signal electrode 6, and a liquid crystal layer formed therebetween. The scanning electrode wire 1 is made to successively be selective conditions, and signals dependent on video signals are synchronously applied to the signal electrode 6 to charge the display picture element capacity 10 through the MiM diode 9. The charge is maintained by utilizing resistance non-linearity in the MiM diode until the scanning electrode wire becomes again selective conditions.

The second to fifth embodiments of the present invention will be illustrated in FIGS. 4 through 7 wherein reference numerals 1, 2, 3, and 4 are identical with those of the first embodiment, i.e., they designate a scanning electrode wire, indication electrode, diode electrode, and another diode electrode, respectively. In any of the embodiments, area of the part defined by over-lapping both the diode electrodes 3 and 4 each other is smaller than that of an overlapped part in case of a conventional shape of electrodes defined by simple, right-angled intersection of the electrodes so that the diode capacity decreases significantly.

As described above, according to the present invention, a MiM diode having uniform electrical characteristics can be fabricated, whereby a high quality liquid crystal display panel which involves little crosstalk between picture elements and has uniform contrast ratio can be provided by such a manner that the MiM diode is constructed by at least two functional parts in diodes, and a shape of the functional parts of the diodes is defined in such that the sum of area of the functional parts of said diodes is constant with respect to amount of deviation from a certain value in mask alignment.

While the present invention has been described in connection with liquid crystal as an electrooptic element, the invention is also effective for active display elements fabricated by combining a substrate on which diode has been formed with an electrooptic element such as electrochromic element, PLZT element, fluorescent display element, electroluminescent element, plasma luminescent element or the like.

Further, although the present invention has been described with reference to preferred embodiments thereof, many modifications and alterations may be made within the spirit and scope of the invention.

What is claimed is:

1. A metal-insulating film-metal diode (MiM diode) which is composed of an insulating film, a metallic film contacting with either surface of said insulating film, and another metallic film contacting with the surface of said insulating film opposite to the former surface, and in which electricity is conducted through a part formed by overlapping both said metallic films within said insulating film, characterized in that said part overlapping is separated into at least two sections which each overlap such that in each said section, an end portion of one of said metallic films exists in the area defined by the other of said metallic films, and said part overlapped has such a shape by which the sum of area in said sections of said overlapped part becomes constant with respect to variation in relative positions of both said metallic films.

* * * * *